United States Patent
Kawai et al.

(10) Patent No.: US 9,224,795 B2
(45) Date of Patent: Dec. 29, 2015

(54) SEMICONDUCTOR DEVICE WITH CONDUCTIVE PILLAR UNIT BETWEEN SHIELD AND SILICON SUBSTRATE

(71) Applicant: KABUSHIKI KAISHA TOSHIBA, Minato-Ku, Tokyo (JP)

(72) Inventors: Shusuke Kawai, Fujisawa (JP); Toshiya Mitomo, Yokohama (JP); Shigehito Saigusa, Yokohama (JP); Tetsuro Itakura, Tokyo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/014,069

(22) Filed: Aug. 29, 2013

(65) Prior Publication Data
US 2014/0061856 A1 Mar. 6, 2014

(30) Foreign Application Priority Data

Aug. 31, 2012 (JP) ................................. 2012-191302
Aug. 8, 2013 (JP) ................................. 2013-165361

(51) Int. Cl.
| H01L 49/02 | (2006.01) |
| H01L 23/522 | (2006.01) |
| H01L 23/64 | (2006.01) |
| H01L 23/66 | (2006.01) |

(52) U.S. Cl.
CPC ............ *H01L 28/40* (2013.01); *H01L 23/5223* (2013.01); *H01L 23/5225* (2013.01); *H01L 23/642* (2013.01); *H01L 23/66* (2013.01); *H01L 28/60* (2013.01); *H01L 2924/0002* (2013.01)

(58) Field of Classification Search
CPC .. H01L 28/40; H01L 23/5223; H01L 27/0805
USPC .......................................... 257/532; 438/381
See application file for complete search history.

(56) References Cited

U.S. PATENT DOCUMENTS 5,696,015 A * 12/1997 Hwang .......................... 438/253

FOREIGN PATENT DOCUMENTS

| JP | 2005-159280 A | 6/2005 |
| JP | 2006-191027 A | 7/2006 |

* cited by examiner

*Primary Examiner* — Evan Pert
*Assistant Examiner* — Changhyun Yi
(74) *Attorney, Agent, or Firm* — Holtz, Holtz, Goodman & Chick PC

(57) ABSTRACT

A semiconductor device includes a silicon substrate, a shield which is disposed on the silicon substrate and includes a conductive material, a capacitor electrode disposed on the shield, and at least one pillar member which is provided between the shield and the silicon substrate and includes a conductive material. The pillar member may be disposed at a location other than a location of a through-hole.

15 Claims, 6 Drawing Sheets

1

SEMICONDUCTOR DEVICE WITH CONDUCTIVE PILLAR UNIT BETWEEN SHIELD AND SILICON SUBSTRATE

CROSS REFERENCE TO RELATED APPLICATIONS

This application is based upon and claims the benefit of priority from the prior Japanese Patent Applications No. 2012-191302 filed on Aug. 31, 2012 and No. 2013-165361 filed on Aug. 8, 2013, the entire contents of which are incorporated herein by reference.

FIELD

Embodiments described herein relate generally a semiconductor device, a high-frequency transmitter and a semiconductor production method.

BACKGROUND

With progress and development of recent semiconductor processes, it became possible to form a most part of a high-frequency circuit into a semiconductor chip, including a capacitor for high-frequency signal transmission.

When a capacitor for high-frequency signal transmission is formed on a silicon substrate, since there are a parasitic capacitance and a parasitic resistance between a capacitor electrode and a silicon substrate, an undesirable problem may occur, in which a high-frequency signal to be normally flowed through the capacitor does not flow through the capacitor, but flows through a silicon substrate via the parasitic capacitance and the parasitic resistance. This undesirable problem is called as a substrate loss.

In order to reduce such a substrate loss, a new measure has been proposed in which a shield made of a conductive material is disposed between the capacitor electrode and the silicon substrate, and this shield is grounded. However, when miniaturization of the semiconductor device progresses, there may be no space to form the shield made of a flat pattern, and thus a large number of through-holes have to be formed on the shield. When the through-holes are formed on the shield, the high-frequency signal leaks out from the capacitor electrode to the silicon substrate, and as a result, the function of the shield itself such as reduction of the substrate loss may be unable to be fulfilled.

DETAILED DESCRIPTION

According to one embodiment, a semiconductor device has a silicon substrate, a shield which is disposed on the silicon substrate and comprises a conductive material, a capacitor electrode disposed on the shield, and at least one pillar member which is provided between the shield and the silicon substrate and comprises a conductive material.

Embodiments will now be explained with reference to the accompanying drawings.

First Embodiment

Figure 1:
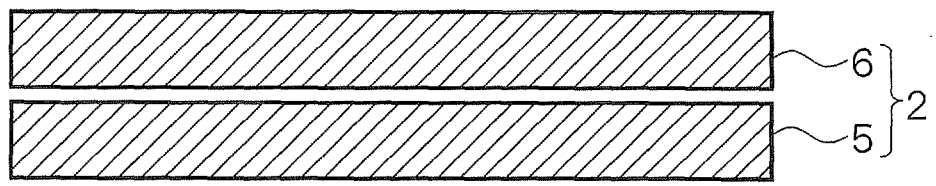
FIG. 1 is a cross-sectional view of a semiconductor device 1 according to a first embodiment.
Figure 1:
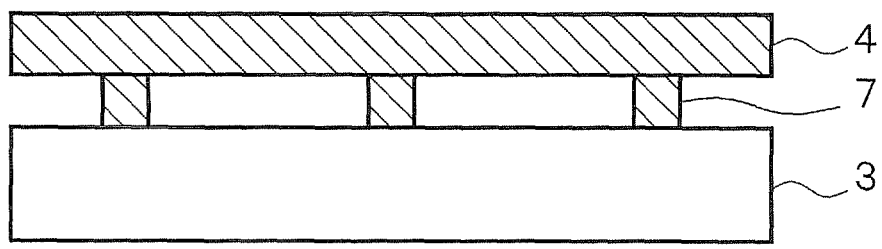

FIG. 1 is a cross-sectional view of a semiconductor device 1 according to a first embodiment. The semiconductor device of FIG. 1 has, for example, a capacitor 2 which transmits a high-frequency signal of GHz band. The semiconductor device 1 of FIG. 1 may be provided with a circuit which amplifies the high-frequency signal or the like, in addition to the capacitor 2. Hereinafter, only a configuration in vicinity of the capacitor 2 will be described.

The semiconductor device 1 of FIG. 1 has a silicon substrate 3, a shield 4 which is disposed on the silicon substrate 3 and has a conductive material, capacitor electrodes 5 and 6 of the capacitor 2 which are disposed on the shield 4, and at least one pillar members 7 which is contacted to the shield 4 and the silicon substrate 3.

The capacitor electrodes 5 and 6 composing of the capacitor 2 is disposed upward and downward, respectively, on the silicon substrate 3, and the capacitor electrodes 5 and 6 are disposed on the shield 4.

The pillar members 7 is a via having a conductive material, for example, which is contacted to the shield 4 and the silicon substrate 3. The number or the size of the pillar members 7 is not limited particularly. The radius thereof may be larger or smaller than that of a normal via.

In FIG. 1, the silicon substrate 3, the shield 4 and the capacitor electrodes 5 and 6 are disposed to be overlapped in upward and downward directions. It is not always necessary to dispose them so as to be completely overlapped. They may be disposed so that only a portion of them is overlapped.

Figure 2:
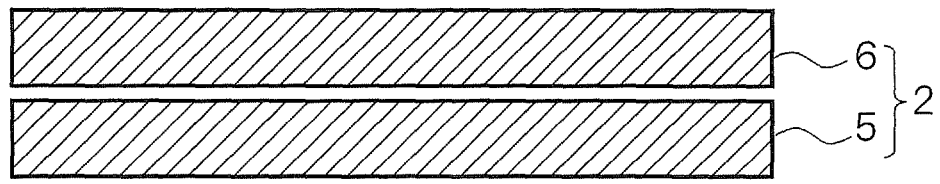
FIG. 2 is a cross-sectional view of the semiconductor device 1 according to one modified example.
Figure 2:
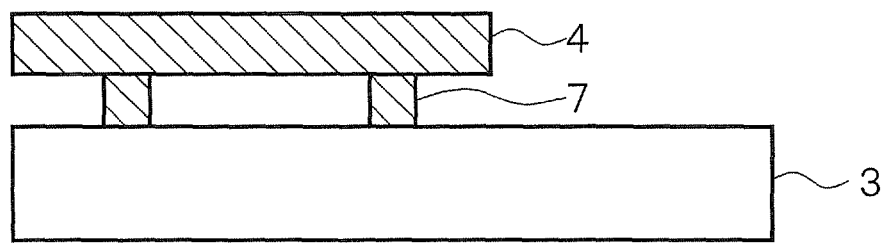

For example, as shown in FIG. 2, a horizontal width of the shield 4 may be smaller than horizontal widths of the capacitor electrodes 5 and 6. In the case of FIG. 2, the shield 4 does not cover the entire capacitor electrodes 5 and 6. There is an area where the capacitor electrodes 5 and 6 are directly opposed against the silicon substrate 3. In this area, the high-frequency signal may leak out from the capacitor electrodes 5 and 6 to the silicon substrate 3, through the parasitic capacitance C and the parasitic resistance R formed between the capacitor electrodes 5 and 6 and the silicon substrate 3.

Figure 3:
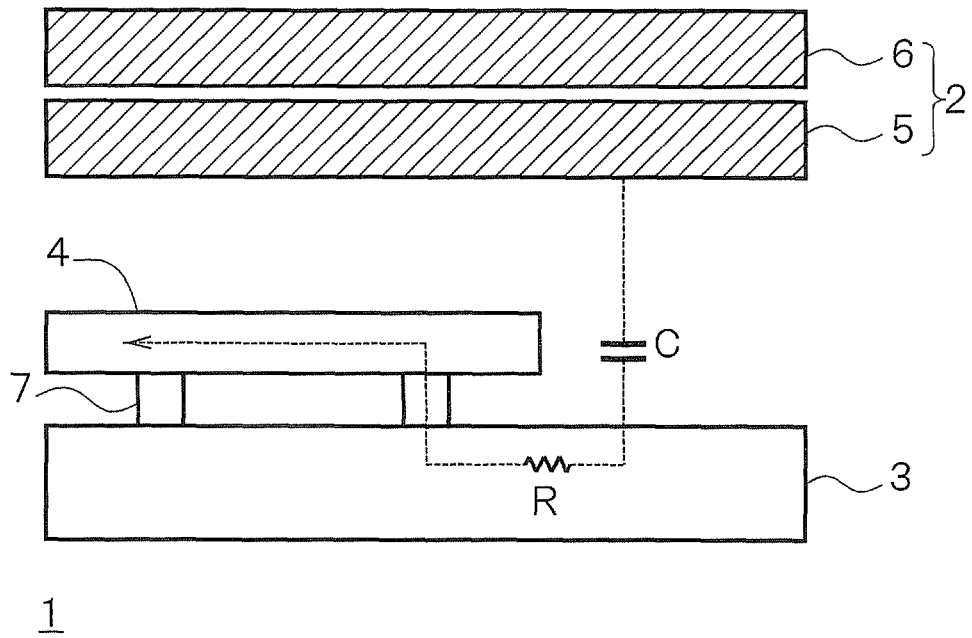
FIG. 3 is a diagram showing a model path of the high-frequency signal in the semiconductor device 1 of FIG. 2.

FIG. 3 is a diagram showing a model path of the high-frequency signal in the semiconductor device 1 of FIG. 2. In the example of FIG. 3, the silicon substrate 3 and the shield 4 are contacted to the pillar members 7. The high-frequency signal flowing from the capacitor electrodes 5 and 6 to the silicon substrate 3 through the parasitic capacitance C and the parasitic resistance R flows through the shield 4 via the pillar members 7. The pillar members 7 are made of the conductive material similarly to the shield 4. Since impedance of the pillar members 7 is far smaller than that of the silicon substrate 3, it is possible to reduce an apparent parasitic resistance R by providing the pillar members of FIG. 7. The reduction of the parasitic resistance R means the reduction of the substrate loss, thereby improving transmission quality of the high-frequency signal.

In this way, the pillar members 7 are current paths to flow the high-frequency signal reached from the capacitor electrodes 5 and 6 to the silicon substrate 3, to the shield 4.

Even if the pillar members 7 are provided, it is impossible to reduce the parasitic capacitance C. However, if an inductor element is connected to the capacitor electrodes 5 and 6 so than a resonance circuit is configured by the inductor element and the parasitic capacitance, it is possible to cancel out influence of apparent parasitic capacitance. Therefore, it is possible to cancel out influence of the parasitic capacitance C between the capacitor electrodes 5, 6 and the silicon substrate 3 and influence of the parasitic resistance R.

Figure 4:
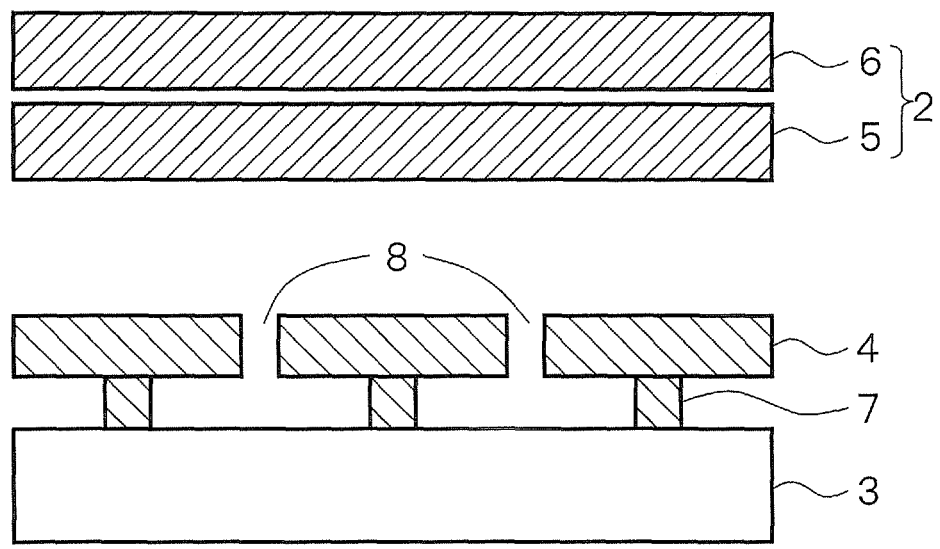
FIG. 4 is a cross-sectional view of the semiconductor device 1 according to the first modified example of FIG. 1.

FIG. 4 is a cross-sectional view of the semiconductor device 1 according to the first modified example of FIG. 1. A plurality of through-holes 8 are formed on the shield 4 of FIG. 4. In FIG. 4, the through-holes 8 are displayed largely in order to emphasize the through-holes 8. The radius and the number of the through-holes 8 are not particularly limited. In FIG. 4, the shield 4 and the silicon substrate 3 are contacted to the pillar members 7 at a location other than a location of forming the through-holes 8.

When the through-holes 8 are formed on the shield 4, there is a likelihood that the high-frequency signal flows through the silicon substrate 3 via the parasitic capacitance C formed on a path passing through the through-holes 8 from the capacitor electrodes 5 and 6 until the silicon substrate 3 and the parasitic resistance R formed by the silicon substrate 3. Even if the high-frequency signal flows through such a path, the high-frequency signal flows through the shield 4 from silicon substrate 3 via the pillar members 7, thereby reducing the apparent parasitic resistance R.

In this way, the pillar members 7 are especially effective when the through-holes 8 are formed on the shield 4. By providing the pillar members 7, it is possible to surely reduce the parasitic resistance R on the signal path of the high-frequency signal flowing through the silicon substrate 3 via the through-holes 8.

In the semiconductor device 1 of FIGS. 3 and 4, it is desirable to dispose at least one pillar members 7 immediately below the capacitor electrodes 5 and 6, i.e. at a location overlapped in upward and downward directions with the capacitor electrodes 5 and 6. The reason is because influences of the parasitic capacitance C and the parasitic resistance R formed between the capacitor electrodes 5, 6 and the silicon substrate 3 becomes the largest immediately below the capacitor electrodes 5 and 6. If the pillar members 7 are provided immediately below the capacitor electrodes 5 and 6, it is possible to effectively flow the high-frequency signal passing from the capacitor electrodes 5 and 6 via the parasitic capacitance C and the parasitic resistance R until the silicon substrate, in a direction of the shield 4 via the pillar members 7.

In view of this, it is desirable to provide as many as pillar members 7 immediately below the capacitor electrodes 5 and 6. Or the radius size of the pillar members 7 may be enlarged.

Figure 5:
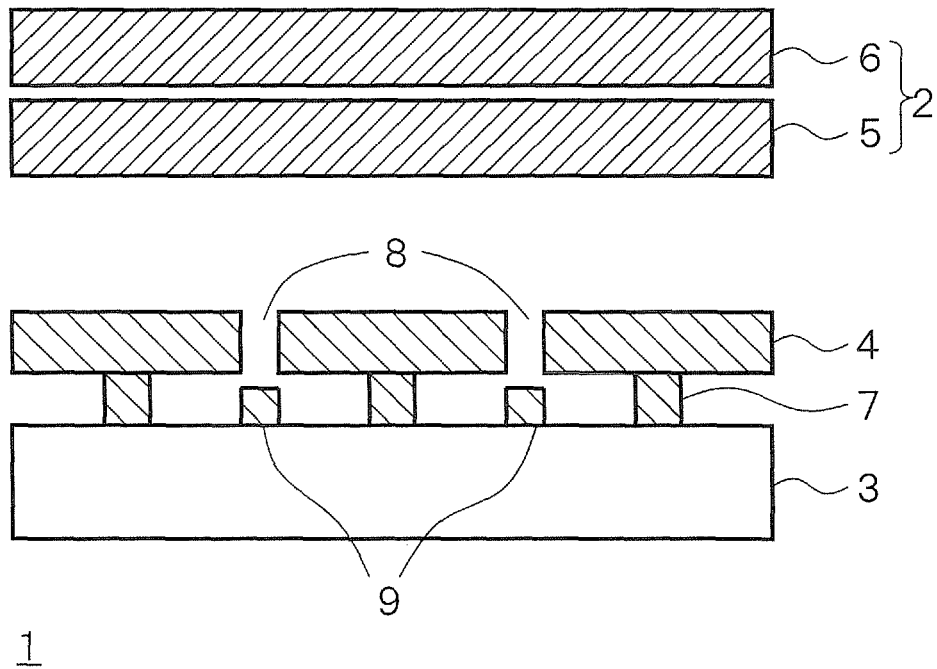
FIG. 5 is a cross-sectional view of the semiconductor device 1 according to a second modified example.

FIG. 5 is a cross-sectional view of the semiconductor device 1 according to a second modified example. In FIG. 5, projection members 9 are disposed immediately below the through-holes 8 of the shield 4, i.e. at a location overlapped in upward and downward directions with the through-holes 8 of the shield 4. Upper surfaces of the projection members 9 are not contacted to the shield 4. Lower surfaces thereof are contacted to the silicon substrate 3.

When a plurality of through-holes 8 are formed on the shield 4, it is desirable to ideally provide the projection members 9 immediately below all the through-holes 8, but the projection member 9 may be provided corresponding to only a portion of the through-holes 8.

The projection member 9 of FIG. 5 is not contacted to the shield 4, but is formed immediately below the through-holes 8. Therefore, it is possible to reduce the parasitic resistance R on the signal path from the capacitor electrodes 5 and 6 through the through-holes 8 until the silicon substrate 3. Therefore, it is possible to reduce the substrate loss due to the parasitic resistance R.

In FIG. 5, in addition to providing the projection member 9 immediately below the through-holes 8, similarly to FIG. 4 etc., the pillar members 7 for contacting the shield 4 and the silicon substrate 3 are also provided.

Figure 6:
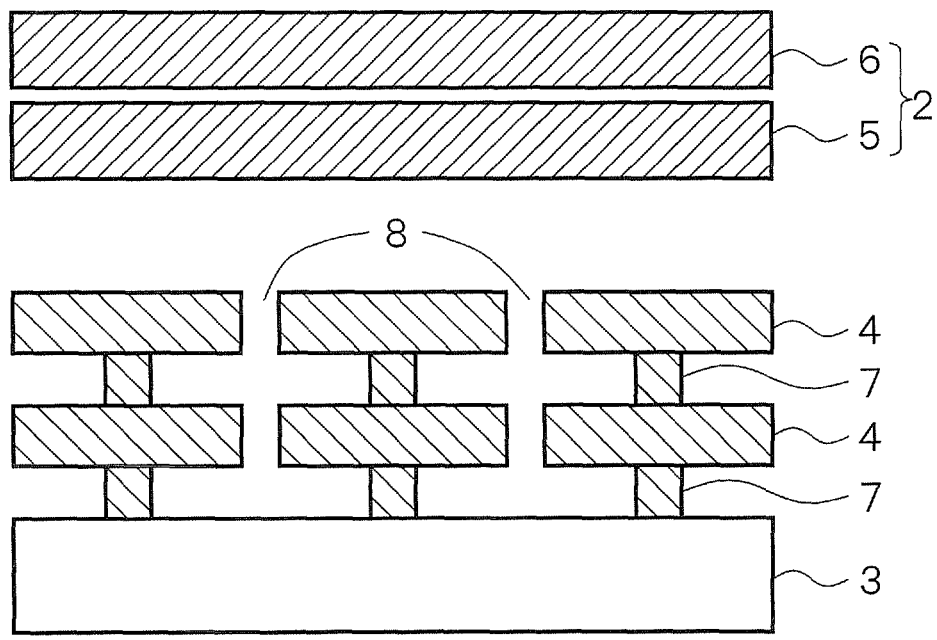
FIG. 6 is a cross-sectional view of the semiconductor device 1 according to a third modified example of FIG. 1.

FIG. 6 is a cross-sectional view of the semiconductor device 1 according to a third modified example of FIG. 1. The semiconductor device 1 of FIG. 6 has a plurality of conductive layers 4 which are disposed in upward and downward directions and functions as the shield. Among these conductive layers 4, two neighboring conductive layers 4 are contacted to the pillar members 7. The lowest conductive layer 4 and the silicon substrate 3 are contacted to the pillar members 7 similarly to FIG. 1 etc.

Even in FIG. 6, by providing the pillar members 7, it is possible to reduce the parasitic resistance R between the parasitic elements 5 and 6 and the silicon substrate 3. By forming the shield 4 by multiple layers, it becomes easier to reduce the parasitic resistance R.

The pillar members 7 for connecting the conductive layers 4 corresponding to the shield 4 is not always disposed at a location overlapped in upward and downward directions. In conformity to the locations of the through-holes 8 of the conductive layers 4, the pillar members 7 may be provided in vicinity to the through-holes 8.

Figure 7:
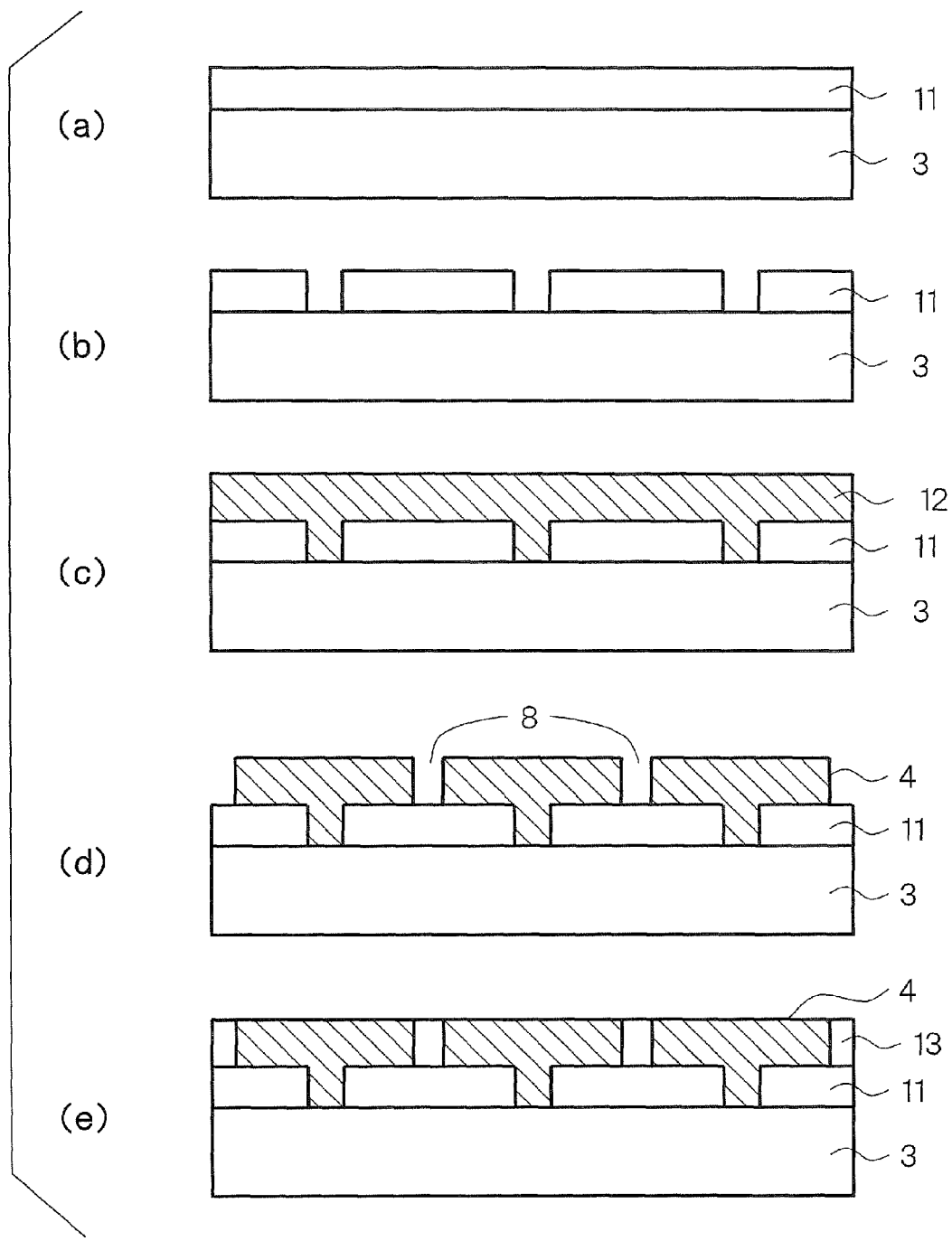
FIG. 7 is a cross sectional view showing production processes of the semiconductor device of FIG. 4.
Figure 8:
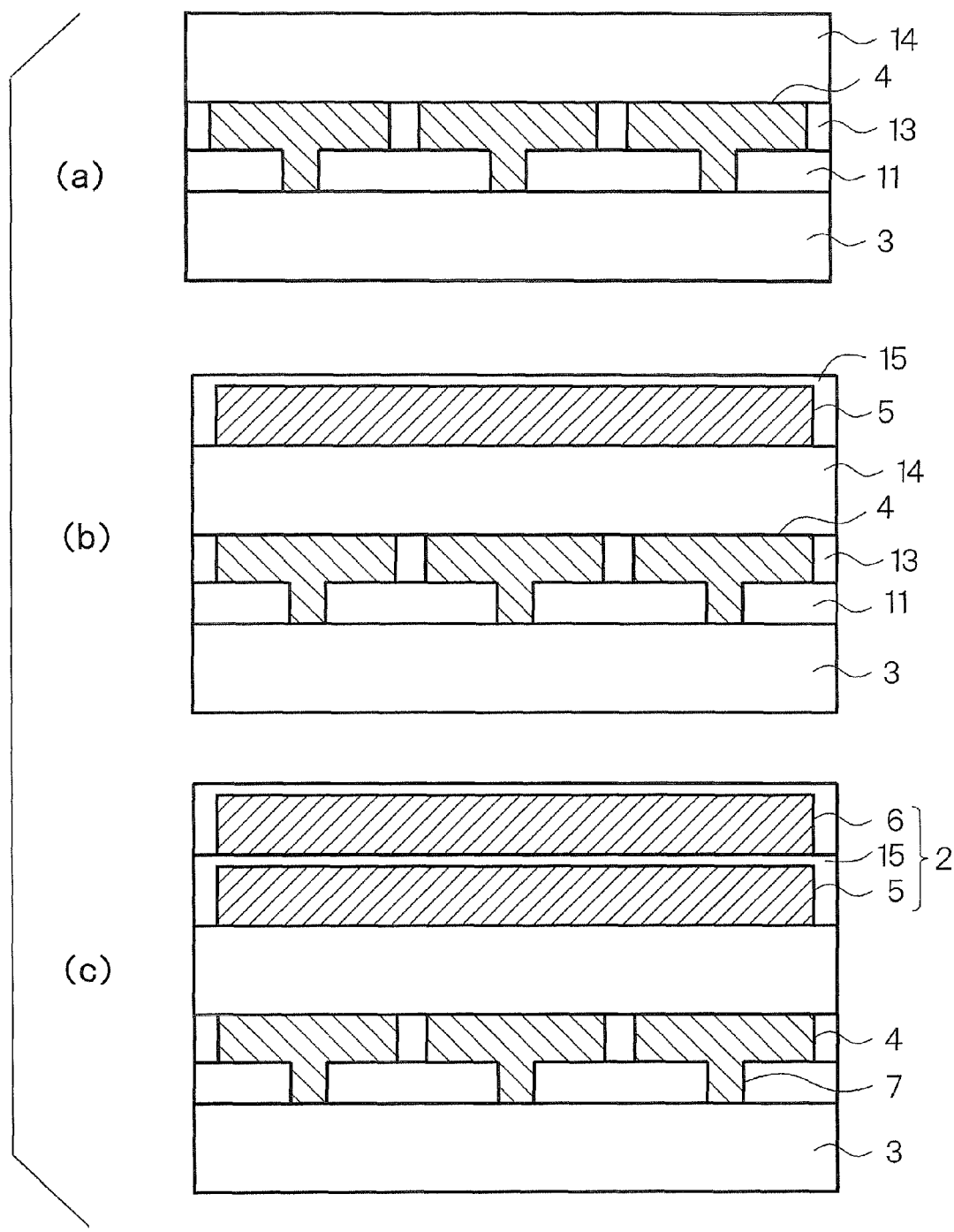
FIG. 8 is a cross sectional view subsequent to FIG. 7.

Next, production steps of the on-described semiconductor device 1 will be described with reference to FIGS. 7 and 8. Hereinafter, the production steps of the semiconductor device 1 of FIG. 4 will be described. Firstly, an insulating film 11 such as $SiO_2$ is deposited on the silicon substrate 3 (FIG. 7(a)).

Next, the insulating film 11 is patterned in conformity to hole positions of the through-holes 8 (FIG. 7(b)). The shape of the through-holes 8 is, for example, square on which a length of one side is, for example, 0.1 um.

Next, the metal layer 12 is deposited, for example, by plating (FIG. 7(c)). The material of the metal layer 12 is, for example, copper or aluminum. At this time, the metal layer 12 is filled inside of the through-holes 12.

Next, the metal layer 12 is patterned by a coating of a resist and dry etching (FIG. 7(d)).

Next, the insulating film 13 is formed inside of the through-holes 8 and in vicinity of the metal layer 12 to flatten the upper surface (FIG. 7(e)). Next, the insulating film 14 is deposited on the shield 4 and the insulating film 13 (FIG. 8(a)).

Next, a metal layer is deposited on the insulating film 14 as a material of a first capacitor electrode 5 of the capacitor 2, for example, by plating. Next, the metal layer is patterned by the coating of the resist and dry etching to form the first capacitor electrode 5 (FIG. 8(b)).

Next, the insulating film 15 is deposited on the first capacitor electrode 5, and then the metal film is deposited as a material of a second capacitor electrode 6 of the capacitor 2, for example, by plating. Next, the metal layer is patterned to form the second capacitor electrode 6 by the coating of the resist and dry etching (FIG. 8(c)).

Therefore, the semiconductor device 1 having a structure shown in FIG. 4 is formed.

As described above, according to the present embodiment, the shield 4 is disposed between the silicon substrate 3 and the capacitor electrodes 5 and 6, and the pillar members 7 are provided to be contacted to the shield 4 and the silicon substrate 3. Therefore, it is possible to reduce the parasite resistance R formed between the capacitor electrodes 5, 6 and the silicon substrate 3, thereby reducing the substrate loss due to the parasite resistance R.

Especially, since the pillar members 7 are contacted to the shield 4 and the silicon substrate 3, even if the through-holes 8 are formed on the shield 4, the high-frequency signal flowing from the capacitor electrodes 5 and 6 to the silicon substrate 3 through the through-holes 8 can be led to the shield 4 via the pillar members 7, thereby reducing the parasite resistance R between the parasite electrodes 5 and 6 and the silicon substrate 3.

Second Embodiment

In a second embodiment described below, a poly-silicon ate fabricated in a step of manufacturing a transistor is used to reduce a parasitic resistance R between the capacitor electrode and the silicon substrate.

Figure 9:
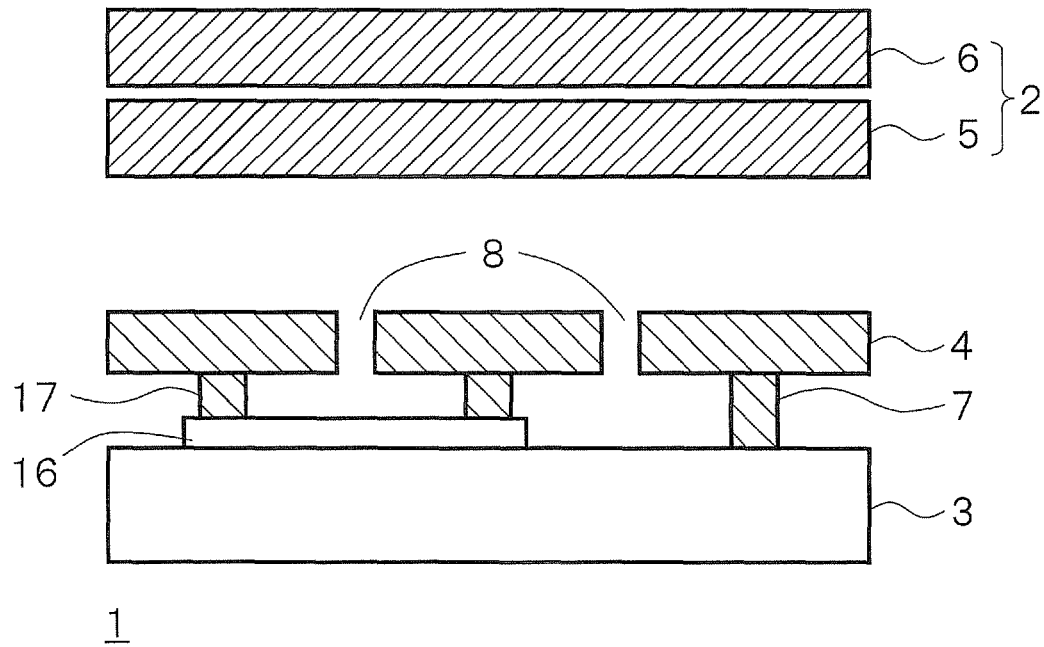
FIG. 9 is a cross sectional view of a semiconductor device according to a second embodiment.

FIG. 9 is a cross sectional view of a semiconductor device 1 according to the second embodiment. The semiconductor device 1 of FIG. 9 has a poly-silicon layer 16 on the silicon substrate 3 and pillar members 17 disposed on the poly-silicon layer 16, each of the pillar members 17 being contacted to the shield 4 and the poly-silicon layer 16.

With the structure of FIG. 9, a current flowing from the capacitor 2 through the through-holes 8 to the poly-silicon layer 16 flows to the shield 4 through the poly-silicon layer 16 and the pillar members 17, thereby reducing the parasitic resistance between the shield 4 and the silicon substrate 3.

The poly-silicon layer 16 is made of the same material as that of a poly-silicon gate of a transistor not shown formed on the silicon substrate 3. Therefore, the poly-silicon layer 16 can be fabricated in the same layer as that of the poly-silicon gate by using a common manufacturing step.

It is unnecessary to dispose the poly-silicon layer 16 in the entire area of the shield 4 disposed opposite to the silicon substrate 3. As shown in FIG. 9, a part of the shield 4 may be connected to the silicon substrate 3 through the pillar members 17.

The pillar member 17 is made of the same material as a wiring material of the transistor not shown. The pillar member 17 can be fabricated in the same layer as that of the wiring material by using a common manufacturing step. Similarly, the shield 4 can be also fabricated using the same material and in the same manufacturing step as those of the transistor not shown.

Figure 10:
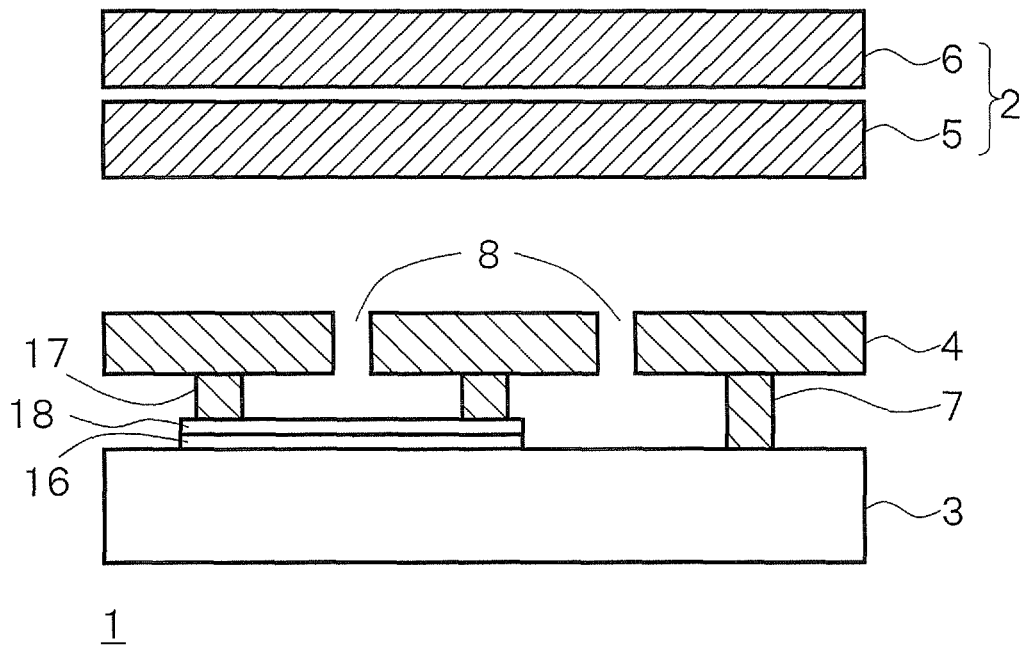
FIG. 10 is a cross sectional view of the semiconductor device according to one modified example of FIG. 9.

The poly-silicon layer 16 does not have a low resistance so much. Therefore, in the poly-silicon gate of the transistor, a silicide layer which is a compound of poly-silicon and a metal material may be formed on the surface portion of the poly-silicon gate of the transistor to lower the resistance of the poly-silicon layer 16. In this case, as shown in FIG. 10, the surface portion of the poly-silicon layer 16 may be changed into the silicide layer in the manufacturing step of changing the poly-silicon gate into silicide. By changing the surface portion of the poly-silicon layer 16 into the silicide layer 18, it is possible to more reduce a substrate capacitance and a substrate resistance, thereby reducing the parasitic resistance R.

In this case, the pillar members 17 are contacted to the silicide layer 18 and the shield 4 disposed above the silicide layer 18. When the surface portion of the poly-silicon layer 16 is changed into the silicide layer 18, a self-align technique may be used to form the silicide layer 18.

The second embodiment is also applicable to the modified examples shown in FIGS. 1, 5 and 6.

As described above, according to the second embodiment, the poly-silicon layer 16 for fabricating the poly-silicon gate of the transistor on the silicon substrate 3 is used to reduce the parasitic resistance R between the shield 4 and the silicon substrate 3. According to the present embodiment, the poly-silicon layer 16, the pillar members 17 and the shield 4 are formed of materials used in the manufacturing steps of the transistor. Therefore, additional manufacturing steps and materials are unnecessary, thereby simplifying the manufacturing steps.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device, comprising:
   a silicon substrate;
   a shield which is disposed on the silicon substrate and comprises a conductive material;
   capacitor electrodes disposed on and apart from the shield; and
   at least one pillar member which is provided between the shield and the silicon substrate and comprises a conductive material, the at least one pillar member electrically connecting the shield and the silicon substrate.

2. The semiconductor device of claim 1, further comprising at least one through-hole in the shield,
   wherein the pillar member is disposed at a location other than a location of the through-hole.

3. The semiconductor device of claim 2, further comprising a projection member disposed immediately below the through-hole, a bottom surface of the projection member being contacted to the silicon substrate and extended in an upward direction of the silicon substrate.

4. The semiconductor device of claim 1, wherein the pillar member is provided at a location overlapped in upward and downward directions with the capacitor electrodes.

5. The semiconductor device of claim 3, wherein the projection member is provided at a location overlapped in upward and downward directions with the capacitor electrodes.

6. The semiconductor device of claim 1, wherein:
   the shield comprises a plurality of layers disposed in upward and downward directions; and
   neighboring layers among the plurality of layers are contacted to the corresponding pillar member.

7. The semiconductor device of claim 1, further comprising a poly-silicon layer disposed on the silicon substrate,
   wherein the pillar member is provided between the shield and the poly-silicon layer.

8. The semiconductor device of claim 7, further comprising a silicide layer on at least an upper surface portion of the poly-silicon layer, wherein the pillar member is contacted to the shield and the silicide layer.

9. A high-frequency transmitter, comprising:
a silicon substrate;
a shield which is disposed on the silicon substrate and comprises a conductive material;
capacitor electrodes of a capacitor which is disposed on and apart from the shield and transmits a high-frequency signal; and
at least one pillar member which is provided between the shield and the silicon substrate, and comprises a conductive material, the at least one pillar member electrically connecting the shield and silicon substrate.

10. The high-frequency transmitter of claim 9, further comprising at least one through-hole in the shield,
wherein the pillar member is disposed at a location other than a location of the through-hole.

11. The high-frequency transmitter of claim 10, further comprising a projection member disposed immediately below the through-hole, a bottom surface of the projection member being contacted to the silicon substrate and extended in an upward direction of the silicon substrate.

12. The high-frequency transmitter of claim 9, wherein the pillar member is provided at a location overlapped in upward and downward directions with the capacitor electrodes.

13. The high-frequency transmitter of claim 11, wherein the projection member is provided at a location overlapped in upward and downward directions with the capacitor electrodes.

14. The high-frequency transmitter of claim 9, wherein:
the shield comprises a plurality of layers disposed in upward and downward directions; and
neighboring layers among the plurality of layers are contacted to the corresponding pillar member.

15. The high-frequency transmitter of claim 9, further comprising a poly-silicon layer disposed on the silicon substrate,
wherein the pillar member is provided between the shield and the poly-silicon layer.

* * * * *